United States Patent
Thompson et al.

(10) Patent No.: US 11,714,136 B2
(45) Date of Patent: Aug. 1, 2023

(54) METHOD OF DETERMINING BATTERY DEGRADATION

(71) Applicant: Electric Power Research Institute, Inc., Charlotte, NC (US)

(72) Inventors: Joseph Hunter Thompson, Palo Alto, CA (US); Peggy Pui Kei Ip, Palo Alto, CA (US); Miles Griffin Evans, Palo Alto, CA (US); Steven Frank Willard, Albuquerque, NM (US)

(73) Assignee: Electric Power Research Institute, Inc., Charlotte, NC (US)

( * ) Notice: Subject to any disclaimer, the term of this patent is extended or adjusted under 35 U.S.C. 154(b) by 319 days.

(21) Appl. No.: 17/097,170

(22) Filed: Nov. 13, 2020

(65) Prior Publication Data

US 2021/0141027 A1    May 13, 2021

Related U.S. Application Data

(60) Provisional application No. 62/934,698, filed on Nov. 13, 2019.

(51) Int. Cl.
G06F 11/30    (2006.01)
G01R 31/392   (2019.01)
G01R 31/3832  (2019.01)

(52) U.S. Cl.
CPC ....... *G01R 31/392* (2019.01); *G01R 31/3833* (2019.01)

(58) Field of Classification Search
CPC .................................................... G01R 31/392
See application file for complete search history.

(56) References Cited

U.S. PATENT DOCUMENTS

2012/0081075 A1\* 4/2012 Skelton .................. B60L 58/15
                                                 180/65.29

FOREIGN PATENT DOCUMENTS

WO    WO-2015025212 A1 \* 2/2015 ........... B60L 11/1803

\* cited by examiner

*Primary Examiner* — Phuong Huynh
(74) *Attorney, Agent, or Firm* — Brandon Trego; Jonathan Hines

(57) ABSTRACT

A method of determining battery degradation retroactively using historical data is disclosed. The method includes the steps of collecting state of charge (SOC) and DC ampere data for a predetermined time period; determining a delta (Δ) SOC based on the data collected; creating a set of SOC regimes having a size based on ΔSOC; filtering the SOC data and determining a set of points which indicate a charging or discharging event; and calculating overall Coulombs associated with each charging or discharging event and for each event, producing a timestamp and Coulombs associated with each event.

8 Claims, 1 Drawing Sheet

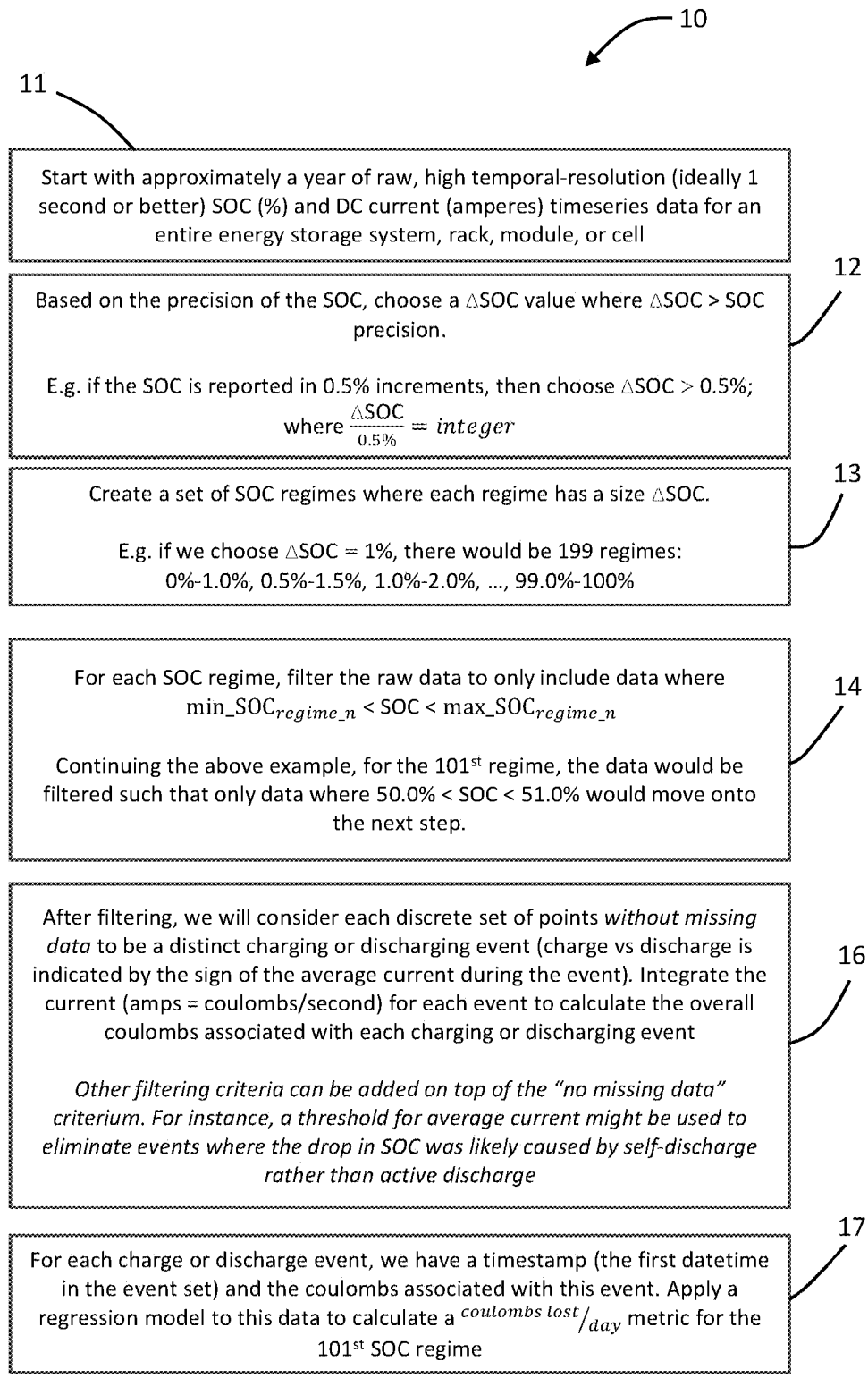

METHOD OF DETERMINING BATTERY DEGRADATION

BACKGROUND OF THE INVENTION

This invention relates generally to a method for determining battery degradation.

Energy storage systems are increasingly being adopted to serve a variety of grid support functions and are appearing in a variety of locations, sizes, and technology formats. Because of the relative immaturity of this technology space, there is sparse information on how well these systems will perform as they propagate and the grid becomes more reliant on their reliability and performance. It is known that these systems degrade and initial capacities erode over time, but there is a dearth of experience on how well they will perform in the long term as current performance expectations are not based on long term operational experience.

In the specific case of battery-based storage, degradation and associated performance erosion of energy storage systems can greatly influence system economics and overall contribution of envisioned storage benefits. Currently, owners and operators rely on vendor-based indications of storage health, associated degradation, and overall performance. Vendor based control systems, on occasion, self-report the health status of the batteries. These are embedded in vendor proprietary firmware and associated sensing systems. This approach utilizes common data and creates an independent approach that is based on continual accumulation of data to an external database and analysis of that data with increasing accuracy as more data is collected. It is understood that there is a variety of sophistication in vendor collection and display of internal data; some vendors provide only rudimentary data while others provide access and do not expose their battery health.

Storage performance is typically assessed through technology specific and proprietary calculations indicating battery State of Charge (SoC), State of Health (SoH), and external meters that gauge the amount of energy imported and exported from the storage system. Owners and operators are not privy to the algorithms used, data structure, or associated accuracy of the proprietary calculations and therefore rely on vendors to self-report on performance.

Accordingly, there is a need for a method that provides independent measurement of storage performance and that becomes more informed and accurate as more operational data and experience is gained.

BRIEF SUMMARY OF THE INVENTION

This need is addressed by the present invention, which provides a retroactive analysis methodology to determine battery degradation.

According to an aspect of the invention, a method of determining battery degradation retroactively using historical data includes the steps of collecting state of charge (SOC) and DC ampere data for a predetermined time period; determining a delta ($\Delta$) SOC based on the data collected; creating a set of SOC regimes having a size based on $\Delta$SOC; filtering the SOC data and determining a set of points which indicate a charging or discharging event; and calculating overall Coulombs associated with each charging or discharging event and for each event, producing a timestamp and Coulombs associated with each event.

According to another aspect of the invention, a method of determining battery degradation retroactively using historical data includes the steps of collecting raw, high temporal-resolution state of charge (SOC) and DC ampere data of an entire energy storage system for a predetermined time period; determining a delta ($\Delta$) SOC where $\Delta$SOC is greater than SOC; creating a set of SOC regimes having a size based on $\Delta$SOC; for each SOC regime, filtering the raw SOC data to only include data where min_$SOC_{regime\ n}$<SOC<max_$SOC_{regime\ n}$; after filtering, determining a set of points which indicate a charging or discharging event; and calculating overall Coulombs associated with each charging or discharging event and for each event, producing a timestamp and Coulombs associated with each event.

BRIEF DESCRIPTION OF THE DRAWINGS

The invention may be best understood by reference to the following description taken in conjunction with the accompanying drawing figures, in which:

FIG. 1 shows a method according to an embodiment of the invention.

DETAILED DESCRIPTION OF THE INVENTION

Referring to the drawings wherein identical reference numerals denote the same elements throughout the various views, FIG. 1 illustrates a method of determining battery degradation and is shown generally at reference numeral 10. In general, the method 10 allows for independent verification of storage performance (as opposed to vendor self-reporting) which then allows for better identification of operating costs, best operation and maintenance practices, and enforcement of vendor warranties, as well as, improved specifications and test procedures for future systems.

The method 10 uses a retroactive analysis methodology that utilizes Battery Management System (BMS)-reported state-of-charge (SOC) and DC ampere measurements from historical battery data, over a period of time (months to years), to derive (1) information about the BMS's SOC estimation algorithm and (2) a simple degradation metric that may indicate the battery system's State-of-Health (SOH). This methodology looks at the number of coulombs (i.e. the integral of the current) that are needed to change the BMS-reported SOC value by the BMS's smallest discernable increment (i.e. the BMS-reported SOC resolution). The change over time in the coulombs required to change the BMS-reported SOC can provide information about a loss of battery capacity (i.e. degradation) and can be used to identify inconsistencies and changes in how the BMS calculates the battery's SOC. This methodology benefits from long-duration (months to years) and high temporal-resolution (sub-five minutes) historical data. It is applicable at any point within an energy storage system where State-of-Charge and DC amperes measurements are reported and is agnostic to the "electricity-in, electricity-out" energy storage technology.

More particularly, as shown in FIG. 1 (Block 11), the method 10 starts with approximately one-year of raw, high temporal-resolution (ideally 1 second or better) SOC (%) and DC current (amperes) timeseries data for an entire energy storage system, rack, module, or cell. As illustrated (Block 12), based on the precision of the SOC, choose a $\Delta$SOC value where $\Delta$SOC>SOC precision, e.g. if the SOC is reported in 0.5% increments, then choose a $\Delta$SOC>0.5%; where $$\frac{\Delta SOC}{0.5\%} = \text{integer.}$$

Next (Block 13), create a set of SOC regimes where each regime has a size ΔSOC, e.g. if we choose ΔSOC=1%, there would be 199 regimes: 0%-1.0%, 0.5%-1.5%, 1.0%-2.0%, 99.0%-100%. For each SOC regime (Block 14), filter the raw data to only include data where min_$SOC_{regime\ n}$<SOC<max_$SOC_{regime\ n}$. Continuing the above example, for the $101^{st}$ regime, the data would be filtered such that only data where 50.0%<SOC<51.0% would move onto the next step.

After filtering (Block 16), consider each discrete set of points without missing data to be a distinct charging or discharging event (charge vs discharge is indicated by the sign of the average current during the event). Integrate the current (amps=coulombs/second) for each event to calculate the overall coulombs associated with each charging or discharging event. Other filtering criteria can be added on top of the "no missing data" criterium. For instance, a threshold for average current might be used to eliminate events where the drop in SOC was likely caused by self-discharge rather than active discharge. For each charge or discharge event (Block 17), a timestamp (the first datetime in the event set) and the coulombs associated with this event are produced. Apply a regression model to this data to calculate a coulombs lost/day metric for the $101^{st}$ SOC regime.

Alternatively, the method 10 for retroactively estimating battery energy storage SOH may be modified so that no part of the method relies on a hidden BMS calculation like State-of-Charge. This modified method is meant to be applied to a fielded battery energy storage system that does not regularly undergo capacity tests. By aggregating the effect of charge entering and leaving the battery system on the battery system's open circuit voltage across a large number of charge-discharge cycles of different depths-of-discharge and at different voltage levels, a single number for the remaining charge capacity of the battery storage system can be generated, which is a key indicator of SOH. Additionally, the number of coulombs of charge that can be discharged between any given starting open circuit voltage and the system's minimum open circuit voltage can be established, which can be used to retroactively estimate the battery system's SOC. Combining this with a well-trained equivalent circuit model can yield a reliable, transparent estimate of the expected amount of energy yield under different discharge conditions from different starting SOCs. The same process can be applied to the charging half-cycles to estimate the amount of grid energy required to charge the battery system from an arbitrary starting SOC to an arbitrary ending SOC.

The foregoing has described a method of determining battery degradation and SOC retroactively using historical data. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends any novel one, or any novel combination, of the features disclosed in this specification (including any accompanying claims, abstract and drawings), or to any novel one, or any novel combination, of the steps of any method or process so disclosed.

We claim:

1. A method of determining battery degradation retroactively using historical data, comprising the steps of:
    collecting state of charge (SOC) and DC ampere data for a predetermined time period, wherein the SOC is reported in percent (%) increments;
    selecting a delta (Δ) SOC increment based on the data collected;
    creating a set of SOC regimes having a size based on the ΔSOC increment;
    filtering the SOC data and determining a set of points which indicate a charging or discharging event;
    calculating overall Coulombs associated with each charging or discharging event and for each event, producing a timestamp and Coulombs associated with each event; and
    calculating Coulombs lost per day.

2. The method according to claim 1, wherein the step of collecting includes the step of collecting raw, high temporal-resolution SOC and DC ampere data.

3. The method according to claim 2, wherein the high temporal-resolution SOC and DC ampere data is collected as a time-series data of one second or less.

4. The method according to claim 2, wherein the predetermined time is about one-year.

5. The method according to claim 1, wherein the step of selecting further includes the step of selecting a ΔSOC increment greater than the SOC increment.

6. The method according to claim 1, wherein the step of filtering further includes the step of filtering the raw data to only include data where min_$SOC_{regime\ n}$<SOC<max_$SOC_{regime\ n}$.

7. A method of determining battery degradation retroactively using historical data, comprising the steps of:
    collecting raw, high temporal-resolution state of charge (SOC) and DC ampere data of an entire energy storage system for a predetermined time period, wherein the SOC is reported in percent (%) increments;
    choosing a delta (Δ) SOC increment where the ΔSOC increment is greater than the reported SOC increments;
    creating a set of SOC regimes having a size based on the ΔSOC increment;
    for each SOC regime, filtering the raw SOC data to only include data where min_$SOC_{regime\ n}$<SOC<max_$SOC_{regime\ n}$;
    after filtering, determining a set of points which indicate a charging or discharging event;
    calculating overall Coulombs associated with each charging or discharging event and for each event, producing a timestamp and Coulombs associated with each event; and
    calculating Coulombs lost per day.

8. The method according to claim 7, wherein the indication of a charging or discharging event is provided by a set of points without missing data.

* * * * *